United States Patent [19]

Jones et al.

[11] Patent Number: 5,561,339
[45] Date of Patent: Oct. 1, 1996

[54] FIELD EMISSION ARRAY MAGNETIC SENSOR DEVICES

[75] Inventors: Gary W. Jones, Poughkeepsie; Jong Kim, Beacon; Steven M. Zimmerman, Pleasant Valley, all of N.Y.

[73] Assignee: FED Corporation, Hopewell Junction, N.Y.

[21] Appl. No.: 302,109

[22] Filed: Sep. 7, 1994

Related U.S. Application Data

[63] Continuation-in-part of Ser. No. 290,238, Aug. 15, 1994, which is a continuation-in-part of Ser. No. 29,880, Mar. 11, 1993.

[51] Int. Cl.⁶ .................................................. H01J 1/16
[52] U.S. Cl. .......................... 313/309; 313/336; 313/351
[58] Field of Search ................................ 313/309, 336, 313/351, 326, 305; 324/250

[56] References Cited

U.S. PATENT DOCUMENTS

| | | | |
|---|---|---|---|
| 3,616,422 | 10/1971 | Doremus | 204/197 |
| 3,665,241 | 5/1972 | Spindt et al. | |
| 3,753,022 | 8/1973 | Fraser, Jr. | 313/78 |
| 3,921,022 | 11/1975 | Levine | 313/309 |
| 3,935,500 | 1/1976 | Oess et al. | 313/495 |
| 3,970,887 | 7/1976 | Smith et al. | 313/309 |
| 3,982,147 | 9/1976 | Redman | 313/309 |
| 3,998,678 | 12/1976 | Fukase et al. | 156/3 |
| 4,008,412 | 2/1977 | Yuito et al. | 313/309 |
| 4,095,133 | 6/1978 | Hoeberechts | 313/336 |
| 4,227,883 | 9/1980 | Kaplan | 29/571 |
| 4,256,532 | 3/1981 | Magdo et al. | 156/628 |
| 4,307,507 | 12/1981 | Gray et al. | 29/580 |
| 4,325,000 | 4/1982 | Wolfe et al. | 313/336 |
| 4,337,115 | 6/1982 | Ikeda et al. | 156/659.1 |
| 4,498,952 | 2/1985 | Christensen | 156/643 |
| 4,513,308 | 4/1985 | Greene et al. | 357/55 |
| 4,578,614 | 3/1986 | Gray et al. | 313/309 |
| 4,614,564 | 9/1986 | Sheldon et al. | 156/657 |
| 4,670,090 | 6/1987 | Sheng et al. | 156/653 |
| 4,683,024 | 7/1987 | Miller et al. | 156/643 |
| 4,685,996 | 8/1987 | Busta et al. | 156/628 |
| 4,724,328 | 2/1988 | Lischke | 250/492.2 |
| 4,774,433 | 9/1988 | Ikebe et al. | 313/362.1 |
| 4,824,795 | 4/1989 | Blanchard | 437/62 |
| 4,853,545 | 8/1989 | Rose | 250/396 R |
| 4,964,946 | 10/1990 | Gray et al. | 156/643 |
| 4,990,766 | 2/1991 | Simms et al. | 250/213 |
| 5,030,895 | 7/1991 | Gray | 315/350 |
| 5,053,673 | 10/1991 | Tomii et al. | 313/308 |
| 5,129,850 | 7/1992 | Kane et al. | 445/24 |
| 5,141,459 | 8/1992 | Zimmerman | 445/24 |
| 5,141,460 | 8/1992 | Jaskie et al. | 445/24 |
| 5,188,977 | 2/1993 | Stengl et al. | 437/89 |
| 5,191,217 | 3/1993 | Kane et al. | 250/423 |
| 5,347,201 | 9/1994 | Liang et al. | 313/309 |

FOREIGN PATENT DOCUMENTS 58-94741(A)  6/1983  Japan ........................ H01J 27/02

OTHER PUBLICATIONS

Warren, J. B., "Control of Silicon Field Emitter Shape with Isotropically Etched Oxide Masks", Inst. Phys. Conf. Ser. No. 99, Section 2, pp. 37–40. 1989.

*Primary Examiner*—Sandra L. O'Shea
*Assistant Examiner*—Vip Patel
*Attorney, Agent, or Firm*—Intellectual Property/Technology Law; Robert G. Rosenthal

[57] ABSTRACT

A field emitter array magnetic sensor (FEAMS) device, comprising: an anode; a base plate member having on a first side thereof a plurality of gated field emitter elements thereon, in spaced proximal relationship to the anode. The plurality of gated field emitter elements and the anode structure are arranged so that each of the gated field emitter elements is in electron emitting relationship to varying electron impingement sites depending on intensity of the magnetic field on the gated field emitter element. The device includes structure for sensing the locations of the anode structure electron impingement sites receiving electrons from the plurality of gated field emitter elements, and determining the strength and orientation of the magnetic field. Also disclosed are various anode configurations which may be usefully employed in the FEAMS device of the invention.

11 Claims, 4 Drawing Sheets

FIELD EMISSION ARRAY MAGNETIC SENSOR DEVICES

CROSS-REFERENCE TO RELATED APPLICATIONS

This is a continuation in part of U.S. patent application Ser. No. 08/290,238 filed Aug. 15, 1994 in the name of Gary W. Jones, which in turn is a continuation in part of U.S. patent application Ser. No. 08/029,880 filed Mar. 11, 1993 in the name of Gary W. Jones.

BACKGROUND OF THE INVENTION

1. Field of the Invention

This invention relates to field emitter array magnetic sensor devices, and subassemblies and components therefor.

2. Description of the Related Art

In the technology of field emission structures and devices, a microelectronic emission element, or a plurality (array) of such elements, is employed to emit a flux of electrons from the surface of the emission element(s). The emitter surface ("tip") is specifically shaped to facilitate effective emission of electrons, and emitted electron beams are directed, e.g., with the assistance of focusing electrodes or other directionally orienting structures, to an anode, which may comprise a plate member bearing an array of phosphors or other electroluminescent elements, to provide a selected visual output.

Field emission display devices may be fabricated in a wide variety of shapes and sizes, and much effort has been directed in recent years to the development of field emission-based flat panel displays, for computer, graphic, and telecommunications applications.

In the fabrication and use of such field emission devices, leakage current and flashover directly affect the cost of electronic components required for flat-panel video displays. These operational phenomena also affect the energy efficiency and performance of the field emission devices.

Tomii et al. U.S. Pat. No. 5,053,673 teaches the formation of vertical field emission structures by forming elongate parallel layers of cathode material on a substrate, followed by attachment of a second substrate so that the cathode material layers are sandwiched therebetween in a block matrix. Alternatively, the cathode material layer can be encased in a layer of electrically insulative material sandwiched in such type of block matrix. The block then is sectioned to form elements having exposed cathode material on at least one face thereof. In the embodiment wherein the cathode material is encased in an insulative material, the sliced members may be processed so that the cathode material protrudes above the insulator casing. The exposed cathode material in either embodiment then is shaped into emitter tips (microtip cathodes).

Spindt et al. U.S. Pat. No. 3,665,241 describes vertical field emission cathode/field ionizer structures in which "needle-like" elements such as conical or pyramidal tips are formed on a (typically conductive or semiconductive) substrate. Above this tip array, a foraminous electrode member, such as a screen or mesh, is arranged with its openings vertically aligned with associated tip elements. In one embodiment disclosed in the patent, the needle-like elements comprise a cylindrical lower pedestal section and an upper conical extremity, wherein the pedestal section has a higher resistivity than either the foraminous electrode or the upper conical extremity, and an insulator may be arranged between the conical tip electrodes and the foraminous electrode member. The structures of this patent may be formed by metal deposition through a foraminous member (which may be left in place as a counter-electrode, or replaced with another foraminous member) to yield a regular array of metal points.

Copending U.S. application Ser. No. 08/029,880 filed Mar. 11, 1993 in the name of Gary W. Jones discloses a vertical field emitter structure and field emission device such as a flat panel display utilizing such structure. Self-aligned gate and emitter fabrication is described, together with virtual column field emitter structures, comprising an emitter or gated emitter with conductive columns connecting the emitter to an underlying resistor or conductor structure formed by chemical or other modification of portions of an underlying layer. The display disclosed in this copending application utilizes field emission structures with low turn-voltages and high accelerating voltages, thereby permitting high brightness, small pixel size, low manufacturing costs, uniform brightness, and high energy efficiency to be achieved.

Copending U.S. application Ser. No. 08/290,238 filed Aug. 15, 1994 in the name of Gary W. Jones discloses an imaging apparatus for providing an image from a display to an observer, including a display generating an optical output, an imaging surface member constructed and arranged for viewing by an observer, and a scanning mirror/lens assembly optically interposed between the display and the imaging surface member, and constructed and arranged to motively repetitively scan the display, generate a scanned image, and transmit the scanned image to the imaging surface member, for viewing of the scanned image. Various field emitter display designs and subassemblies are described in this copending application, which may be usefully employed in the imaging apparatus.

In field emitter technology, as exemplified by the structures and devices described in the above-discussed patents, there is a continuing search for improvements, particularly under the impetus of commercial as well as military interest in the development of practical and reliable field emitter array (FEA) devices.

In reference to the apparatus of the present invention, as hereinafter disclosed in greater detail, various magnetic sensor devices are in common use in a wide variety of applications, including mapping of magnetic fields, measurement of electric current at large distances, and position sensing. The known and commercially available sensors include semiconductor Hall effect sensors and magnetic sensors of various other types. However, the conventionally known and available magnetic sensors generally suffer the deficiency of having inversely related response speed and sensitivity characteristics, and thus being incapable of high speed response and high magnetic field sensitivity.

It would be a substantial advantage in the art, and is an object of the present invention, to provide a field emission electron source characterized by low turn-on voltages, low gate-to-source current leakage, and low anode-to-gate or source current leakage.

It is another object of the present invention to provide a field emission source of such type having applicability to flat-panel displays using cathodoluminescent phosphors, CRT's, electron beam tubes, and other free electron devices.

Other objects and advantages of the invention will be more fully apparent from the ensuing disclosure and appended claims.

SUMMARY OF THE INVENTION

The present invention relates to field emitter array magnetic sensor (FEAMS) devices, and novel subassemblies (e.g., anode structures) thereof, as hereinafter more fully described, and as will be more fully apparent from the ensuing disclosure and appended claims.

DETAILED DESCRIPTION OF THE INVENTION, AND PREFERRED EMBODIMENTS THEREOF

The disclosures of U.S. patent application Ser. No. 08/290,238 filed Aug. 15, 1994 in the name of Gary W. Jones, is hereby incorporated herein by reference in their entirety.

The present invention relates to a Field Emitter Array Magnetic Sensor (FEAMS), a multipoint 2-D or polar magnetic field sensor based on FEA technology. This sensor utilizes the magnetic deflection of multiple electron beams to determine a 2-D cross-sectional intensity gradient of a magnetic field. This sensor also has the potential for a much higher speed response than a semiconductor Hall effect sensors or other magnetic sensors. No other known device has this capability at high sensitivity.

FEAMS applications include mapping of magnetic fields, measurement of electric current at large distances, and position sensing. Arrays of these devices could be used for electric current sensing with much greater speed and ease of use than other loop-type measurement tools. The sensor should also have very little effect on its surroundings in high sensitivity situations.

Functionally, the FEAMS device is a novel and unique structure which resembles a field emitter array (FEA) based flat panel display, yet makes use of deflection to a grid rather than a phosphor as the anode (although a phosphor/conductor combination could be used on the grid if desired).

The FEAMS device comprises a group of field emitter device arrays (FEAs) under a grid of anodes. When a magnetic field is present, electrons emitted from the field emitters are deflected toward a point on the grid which indicates the strength and orientation of the field. The basic cross-sectional layout of such a sensor is shown in FIG. 1, comprising an anode plate 520 (e.g., of glass), gated emitters 522 on a base plate 524, and a current-carrying wire 526 generating a magnetic field.

Figure 1:
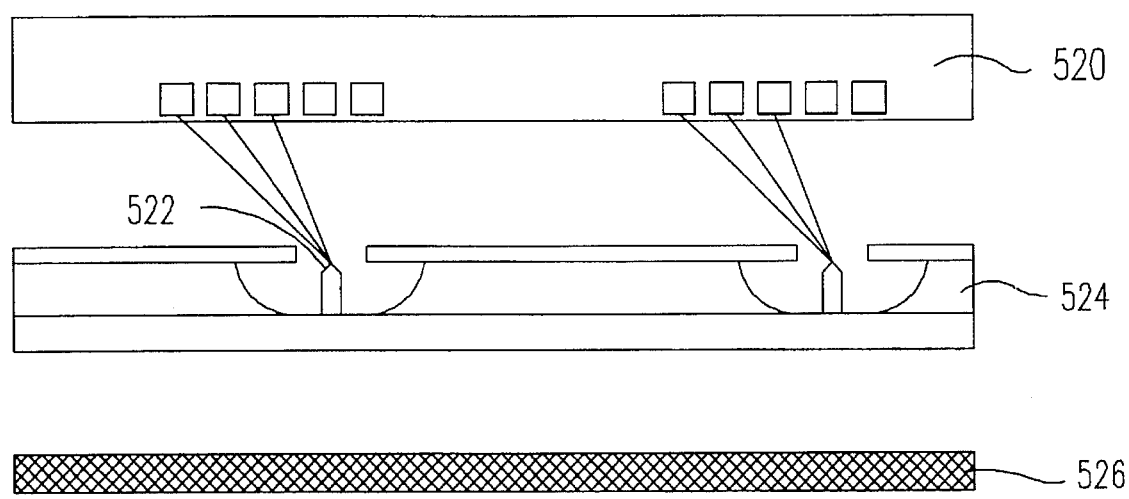
FIG. 1 is a schematic representation of a field emitter array magnetic sensor (FEAMS) device according to one embodiment of the invention.
Figure 2:
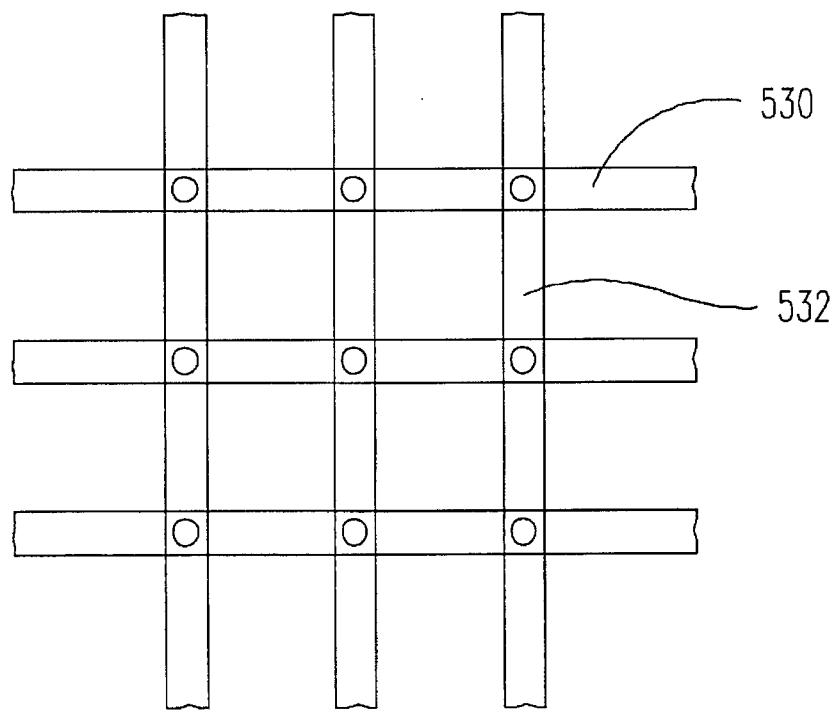
FIGS. 2–4 show the details of various anode structures that may be advantageously utilized in the FEAMS device of FIG. 1.
Figure 3:
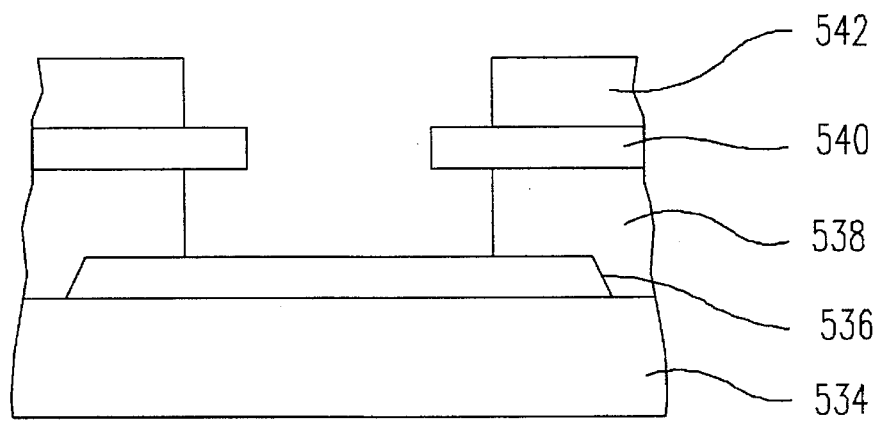

Configurations of various suitable anode structures for FEAMS devices are shown in FIGS. 1, 2 and 3.

FIG. 2 is a top plan view of an anode structure comprising horizontal beams 530 and vertical beams 532, having Faraday cup structures at their loci of intersection with one another, as shown in FIG. 3, wherein such Faraday cup structure comprises glass substrate layer 534, conductor layer 536, e.g., of titanium or ITO, dielectric layer 538, e.g., of silicon dioxide, metal layer 540, e.g., titanium, and dielectric layer 542, e.g., silicon dioxide.

In operation of such anode structure, the undeflected beam would typically start at a central point and be nulled. The anode may be surrounded by mu-metal to isolate the anode during calibration of the device.

Figure 4:
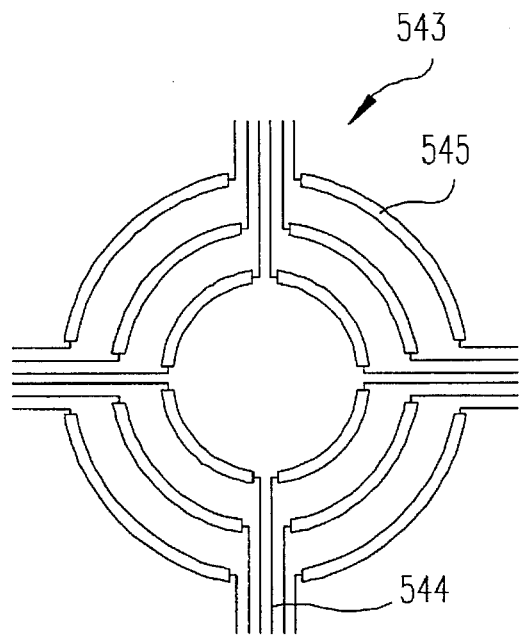

FIG. 4 is a top plan view of another anode structure 543, featuring concentric anode arcuate segments 545, associated with conductive leads 544, as shown.

In such emitter structures, accurate alignment of the anode to the emitter array may not be necessary in the 2-D array, since any emitter position centered in the anode array can be nulled as the starting position.

The FEA's capability to produce very low energy electron beams which can be easily deflected, and its ability to be placed in arrays, combined with the potential to make such an array from almost completely non-magnetic pervasive materials, render the above-described aspect of the invention a significant advance in the art. Since the FEA can also operate at very low current, the self-induced magnetic field will be very low. The FEA array can be very thin relative to an array utilizing another type of electron source such as thermionic emission electron source devices. This combination of features and the ease of deflection of the electron beams over a short distance make this the fastest response magnetic sensor possible.

The anode arrays shown in FIGS. 2 and 4 represent unique anode configurations which are consistent with the FEA capability. These anodes consist of a 2-D or polar arrangement of segments surrounding the center beam. Shifting of the central electron beam from one anode pad to the other can be sensed. Denser arrays of anode pads can be used to increase the resolution of the device. Comparators can be used to determine the split of the beam from one anode site to another for very accurate measurements, or a purely digital array could be fabricated with small anode sites.

As a further modification, a CCD array could be used as the target which would provide very high sensitivity to beam position shifts.

Colored phosphor patterns could even be used for a direct color indicator of magnetic field gradient and direction. A changing pattern density of color dots would provide a color shift based on field direction and intensity..

Integrated circuits could be flip chip, TAB, or wire bond mounted onto this type of sensor to provide analysis of large numbers of anode sites. Analysis could also be performed using FEA circuitry directly by creating a resistor or capacitor bridge.

Data could even be displayed using a portion of the same FEA array configured as a display, thereby providing a very low cost system.

The array can be configured in a semicircle and used to measure electric current in small spaces. Since a map of the field can be obtained, accurate assessment of current can be obtained without a complete circle. The magnetic field intensity pattern can then be reconstructed from a plane interception. This has not previously been practical.

A sensor of such type can be brought to a distance from the conductor and used to easily assess the signal current. Since these devices can be made very small, current may be measured on very small conductive lines.

If a 2-D FEAMS array is placed over an integrated circuit, it is possible to assess the current flow, frequency, and electric current patterns on the chip, including current measurements in a non-contact mode, at speeds as high as any currently practical silicon ICs. A high density array of emitters and anodes would permit such measurements.

Figure 5:
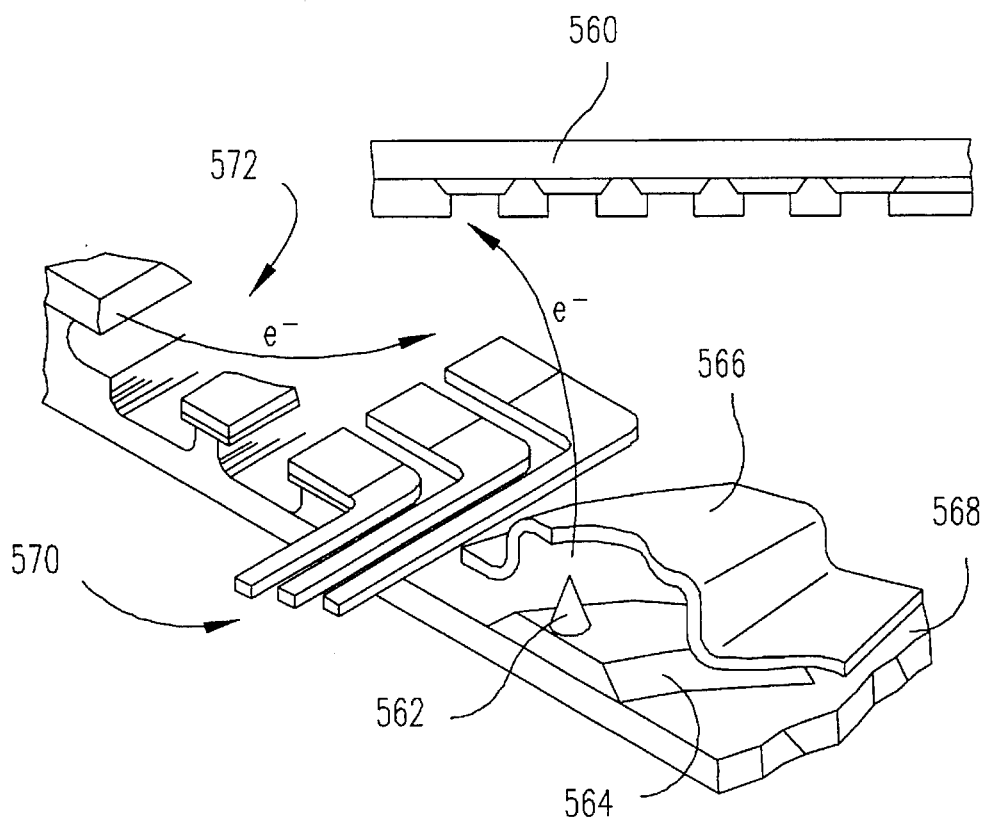
FIG. 5 is a perspective schematic view of a FEAMS device for the detection and determination of magnetic field, according to one embodiment of the invention.

FIG. 5 is a perspective schematic view of such a FEAMS device for the detection and determination of magnetic field. The device comprises a conductive anode array 560 (a CCD array may alternatively be used as an anode structure), overlying an emitter structure including vertical emitter element 562 disposed on conductor 564 feeding emitter element 562, with a gate conductor 566 over the dielectric layer 568. This structure also includes a lateral emitter array 572 with an array of connections 570 to the lateral emitter anodes.

Figure 6:
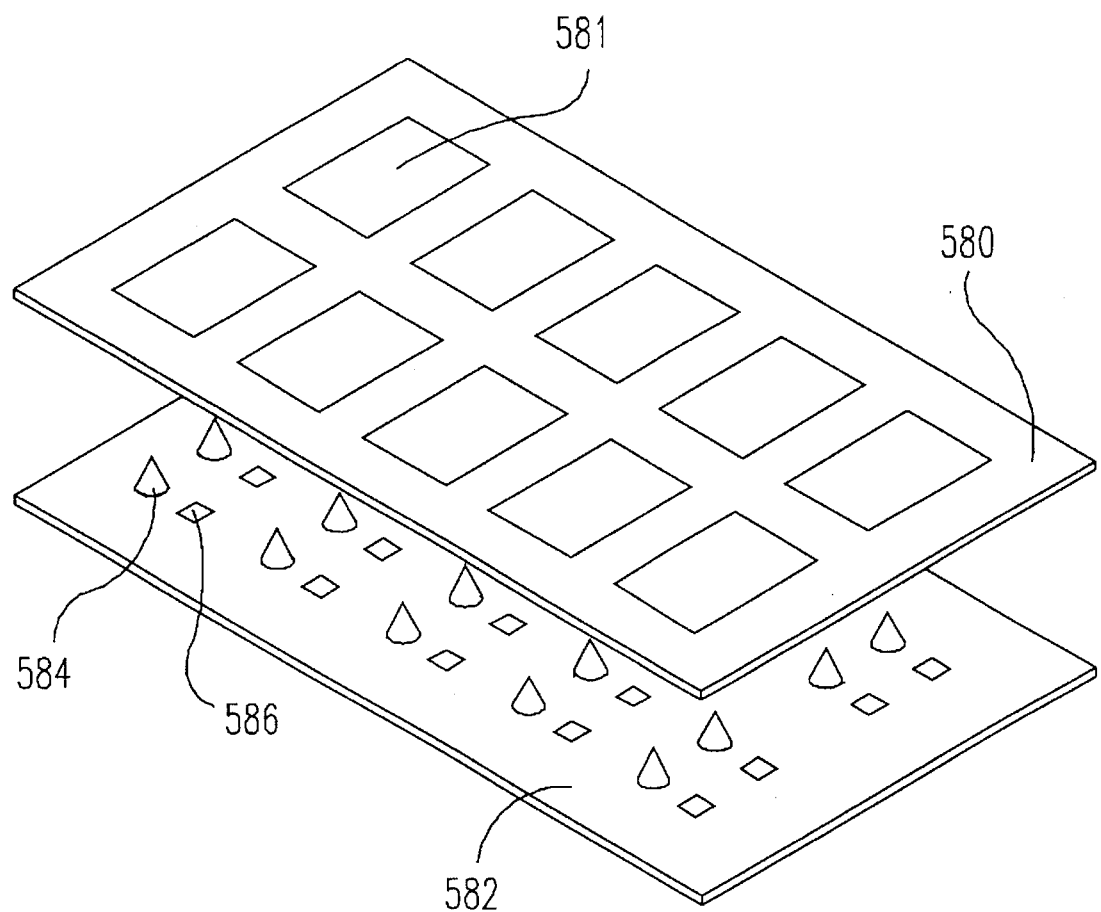
FIG. 6 is a schematic representation of a FEA plate assembly, for use in a FEAMS device, according to another aspect of the invention.

Combinations of edge emitters on portions of the anode or FEA substrate with arrays of horizontal anodes and vertical emitters can be used to provide measurements in opposing directions. A corresponding structure for such application is shown in FIG. 6, comprising spaced apart dielectric plates 580 and 582. Dielectric plate 580 comprises on its upper surface a vertical emitter anode array 581, and dielectric plate 582 comprises on its upper surface a plurality or arrays of vertical emitter elements 584 and a plurality or arrays of lateral emitter elements 586 (these should point in several directions to provide accurate B field analysis in all directions).

Groups of emitters may be used. Resistors should be used with each emitter to provide for accurate control of current at low levels. Low work function coatings and gate openings as small as practical using available manufacturing techniques should be used to permit the lowest voltage emission.

The anode voltage in such sensors should be set at a more positive voltage than the gate, generally at least 25% higher than the gate to minimize electron collection by the gate. An array of emitters with a common anode can be used in the FEAMS device to amplify the differential signal or compare current or voltage if desired. It is possible to set the gate and anode voltage at the same potential or nearly the same potential to detect slightly off-center axis magnetic or electric fields. Small changes in either magnetic or electric fields can result in shifting of the current between the gate and anode. Alternatively biasing the gate and anode to be more positive than the other, and sensing the current, can provide additional information on fields in the sensor.

A perimeter seal of frit or non-magnetic metal (e.g., aluminum) is desired in the fabrication of the FEAMS device to maintain vacuum conditions in the vicinity of the emitters. A vacuum getter, either patterned on one of the plates, or as an extension, is advantageously employed.

While the invention has been illustratively described herein, with reference to various exemplary embodiments, features and components, it will be recognized that numerous variations, modifications and other embodiments are possible, and the invention therefore is to be broadly interpreted and construed to encompass such alternative variations, modifications and other embodiments, within the spirit and scope thereof.

What is claimed is:

1. A field emitter array magnetic field sensing device for determining a magnetic intensity gradient of a corresponding magnetic field, comprising:

an anode structure defining a multiplicity of electron impingement sites in a predetermined spaced apart relation to one another;

a base plate member having on a first side thereof a plurality of gated field emitter elements thereon, each of said gated field emitter elements being in spaced proximal and electron emitting relationship to at least two corresponding ones of said electron impingement sites of the anode structure, and with the plurality of gated field emitter elements and the anode structure being constructed and arranged such that each of the gated field emitter elements is in electron emitting relationship to varying electron impingement sites depending on tile intensity of said magnetic field between said gated field emitter element and said anode structure, such that the electrons emitted by each of said gated field emitters are deflected by the strength of the magnetic field to impinge on a corresponding at least one of said at least two corresponding electron impingement sites on the anode structure;

means for correlating the relative deflections of the electrons according to which said at least two corresponding electron impingement sites receives the electrons from the corresponding gated field emitter element and thereby determining the strength and orientation of the magnetic field wherein said means for correlating the relative deflections of the electrons and thereby determining the strength and orientation of the magnetic field are selected from the group consisting of anode-analysis integrated circuits, resistor bridge circuitry, capacitor bridge circuitry, comparators for determining splits of electron beams from one anode site to another, and digital array means.

2. A field emitter array magnetic sensor according to claim 1, wherein the anode structure comprises an array of multiple anode elements.

3. A field emitter array magnetic field sensing device according to claim 1, wherein the anode structure comprises an anode plate member, and wherein the anode plate member is in spaced apart relationship to the base plate member having a plurality of gated field emitter elements on a first side thereof.

4. A field emitter array magnetic field sensing device according to claim 3, wherein the anode plate member and the base plate member are in sealed relationship to one another.

5. A field emitter array magnetic field sensing device according to claim 4, wherein the sealed relationship is provided by a perimeter seal of said plate members.

6. A field emitter array magnetic field sensing device according to claim 5, wherein the perimeter seal comprises a seal of a material selected from the group consisting of frit and non-magnetic metal.

7. A field emitter array magnetic field sensing device according to claim 1, wherein said means for correlating the relative deflections of the electrons and thereby determining the strength and orientation of the magnetic field, comprise comparators for determining the split of an electron beam from one anode structure impingement site to another anode structure impingement site.

8. A field emitter array magnetic field sensing device according to claim 1, wherein said means for correlating the relative deflections of the electrons and thereby determining the strength and orientation of the magnetic field, comprise digital array means.

9. A field emitter array magnetic field sensing device according to claim 1, wherein said means for correlating the relative deflections of the electrons and thereby determining the strength and orientation of the magnetic field, comprise means selected from the group consisting of anode-analysis integrated circuits, field emitter array resistor bridge circuitry, and field emitter array capacitor bridge circuitry.

10. An anode structure comprising horizontal anode members and vertical anode members defining a rectangular lattice structure, with said horizontal and vertical anode members having at their loci of intersection with one another electron impingement structures comprising a substrate layer, a conductive layer on the substrate layer, the conductor layer being overlyingly peripherally surrounded by a dielectric layer having thereon a conductor layer overlaid by a second dielectric layer; and the electron impingement structures being joined to means for determining deflection of an electron beam impinged on the anode structure in the presence of a magnetic field which acts to deflect the electron beam from an impingement path which would obtain in the absence of the magnetic field, and thereby determining the strength and orientation of the magnetic field, wherein said means for correlating the relative deflections of the electrons and thereby determining the strength and orientation of the magnetic field are selected from the group consisting of anode-analysis integrated circuits, resistor bridge circuitry, capacitor bridge circuitry, comparators for determining splits of electron beams from one anode site to another, and digital array means.

11. A field emitter array magnetic field sensing device for sensing magnetic field strength and orientation, comprising:

an anode structure defining a multiplicity of electron impingement sites in a predetermined spaced apart relation to one another, and comprising concentric arcuate anode segments associated with conductive leads;

a base plate member having on a first side thereof a plurality of gated field emitter elements thereon, each of paid gated field emitter elements being in spaced proximal relationship to at least two corresponding ones of said electron impingement sites of the anode structure, such that the electrons emitted by each of said gated field emitters are deflected by the strength of the magnetic field to impinge on electron impingement sites on the anode structure means joined to said conductive leads, for correlating the relative deflections of the electrons according to which of said at least two corresponding electron impingement sites receives the electrons from the corresponding gated field emitter element and thereby determining the strength and orientation of the magnetic field, wherein said means for correlating the relative deflections of the electrons and thereby determining the strength and orientation of the magnetic field are selected from the group consisting of anode-analysis integrated circuits, resistor bridge circuitry, capacitor bridge circuitry, comparators for determining splits of electron beams from one anode site to another, and digital array means.

* * * * *